(12) United States Patent
Chang et al.

(10) Patent No.: US 6,365,500 B1
(45) Date of Patent: Apr. 2, 2002

(54) COMPOSITE BUMP BONDING

(75) Inventors: Shyh-Ming Chang; Jwo-huei Jou, both of Hsinchu; Yu-Chi Lee, Taipei Hsien; Dyi-Chung Hu, Hsinchu Hsien, all of (TW)

(73) Assignee: Industrial Technology Research Institute, Hsin-Chu (TW)

( * ) Notice: Subject to any disclaimer, the term of this patent is extended or adjusted under 35 U.S.C. 154(b) by 1011 days.

(21) Appl. No.: 08/518,182

(22) Filed: Aug. 23, 1995

Related U.S. Application Data

(63) Continuation of application No. 08/239,375, filed on May 6, 1994, now abandoned.

(51) Int. Cl.$^7$ .............................................. H01L 21/44
(52) U.S. Cl. ...................................... 438/614; 438/615
(58) Field of Search ................................ 257/737, 738; 228/180, 22; 438/614, 615

(56) References Cited

U.S. PATENT DOCUMENTS

| | | | |
|---|---|---|---|
| 3,401,126 A | | 9/1968 | Miller et al. ................. 252/514 |
| 3,763,550 A | * | 10/1973 | Oakes .......................... 437/183 |
| 3,809,625 A | | 5/1974 | Brown et al. ................. 204/15 |
| 4,749,120 A | | 6/1988 | Hatada ........................ 228/123 |
| 4,865,245 A | * | 9/1989 | Schulte et al. .......... 228/180.22 |
| 4,916,523 A | | 4/1990 | Sokolovsky et al. .......... 357/74 |
| 4,963,002 A | | 10/1990 | Tagusa et al. .............. 350/336 |
| 4,965,227 A | * | 10/1990 | Cham et al. ................. 437/207 |
| 5,134,460 A | | 7/1992 | Brady et al. .................. 357/71 |
| 5,298,331 A | * | 3/1994 | Kanakarajan et al. ........ 428/458 |
| 5,331,235 A | * | 7/1994 | Chun .......................... 257/777 |

FOREIGN PATENT DOCUMENTS

| | | | |
|---|---|---|---|
| EP | 372880 | * | 6/1990 |
| EP | 385787 | * | 9/1990 |
| JP | 5892230 | * | 6/1983 |
| JP | 266953 | * | 3/1990 |
| JP | 2180036 | * | 7/1990 |
| JP | 362927 | * | 3/1991 |
| JP | 373535 | * | 3/1991 |
| JP | 3101234 | * | 4/1991 |
| JP | 46841 | * | 1/1992 |
| JP | 046841 | * | 1/1992 |
| JP | 430532 | * | 2/1992 |
| JP | 433348 | * | 2/1992 |
| JP | 4151843 | * | 5/1992 |
| JP | 562981 | * | 3/1993 |
| JP | 5144877 | * | 6/1993 |
| JP | 5211149 | * | 8/1993 |

OTHER PUBLICATIONS

"Pressure Contact Type Chip Join Technique"; *IBM TDB*, W. C. Ward, vol. 18 No. 9, Feb. 1976, p. 2817.*

* cited by examiner

*Primary Examiner*—David E. Graybill
(74) *Attorney, Agent, or Firm*—George O. Saile; Stephen B. Ackerman; Larry J. Prescott

(57) ABSTRACT

A bonded structure comprising the physical and electrical connections between an integrated circuit element and substrate using a composite bump comprised of a single polymer body of low Young's Modulus and a conductive metal coating. The bond can be formed using thermocompression bonding, ultrasonic bonding, application of heat or application of light. The bond can also be formed using a non conductive adhesive between the integrated circuit element and the substrate. The bond can also be formed with a conductive adhesive coating on the composite bump.

20 Claims, 5 Drawing Sheets

COMPOSITE BUMP BONDING

This application is a continuation of Ser. No. 08/239,375 filed May 6, 1994 abn.

RELATED PATENT APPLICATIONS (1) Ser. No. 08/239,424, filed May 6, 1994, U.S. Pat. No. 5,393,697, entitled Composite Bump Structure and Methods of Fabrication assigned to the same assignee.

(2) Ser. No. 08/239,380, filed May 6, 1994, U.S. Pat. No. 5,731,328, entitled Composite Bump Flip Chip Bonding assigned to the same assignee.

BACKGROUND OF THE INVENTION

(1) Field of the Invention

The invention relates to the joining of integrated circuit elements to the next level of integration, or that level of integration to the following level, and more particularly to the formation of the bonded structure which comprises the physical and electrical connection between the integrated circuit element and the next level of integration.

(2) Description of the Related Art

In the manufacture of highly dense integrated circuits the formation of an inexpensive and highly reliable mechanical bond and electrical interconnection between the integrated circuit element and substrate has long been recognized to be of key importance. Some time ago a solution to this need was patented by L. F. Miller et al in U.S. Pat. No. 3,401,126. This method worked well for many years but increasing levels of integration and circuit density have made the need for interconnections on an increasingly fine pitch of key importance.

A method for achieving increased interconnection density was patented by K. Hatada in U.S. Pat. No. 4,749,120. This method employs a metal bump as the electrical interconnection between the integrated circuit chip and the substrate while holding the integrated circuit chip in place with a resin coating on the substrate acting as an adhesive between chip and substrate. This method has the disadvantage of a relatively high Young's Modulus for metals. As a result of the high Young's Modulus a very large bonding force is required between the integrated circuit chip and the substrate during the micro-bump bonding process while the resin is undergoing its curing cycle. After the bonding process the gold micro-bump will tend to return to its original shape and the recoil forces will disengage some of the micro-bumps from the electrodes on the substrate. Another method patented by Y. Tagusa et al in U.S. Pat. No. 4,913,002 employs nickel plated plastic beads or silver particles to achieve the electrical connection, but the former suffers from small contact surface area and the latter suffers the disadvantage of a relatively high Young's Modulus for silver.

U.S. Pat. No. 4,916,523 issued to Sokolovsky et al shows a unidirectional conductive adhesive to bond the integrated circuit chip to the substrate. U.S. Pat. No. 5,134,460 issued to Brady et al shows conductive metal bumps coated with a gold layer.

SUMMARY OF THE INVENTION

It is the principal object of the invention to provide a bonded structure comprising the electrical and physical connections between integrated circuit elements and the corresponding substrate wherein very dense wiring patterns can be accommodated economically and the resulting connections are extremely reliable.

This object is achieved with a bonded structure comprising the integrated circuit element input/output pads, composite bumps comprised of a single polymer body with a Young's Modulus which is low compared to metals and a conductive metal coating covering the polymer body, and the substrate input/output pads. The conductive metal coating covering the polymer body must be chosen to provide good adhesion to the polymer body and may include an adhesive layer and a barrier layer in addition to a conductor layer. The low Young's Modulus of the polymer, about $0.4 \times 10^6$ to $0.5 \times 10^6$ psi, allows the bond to be made with very low bonding force and greatly reduces or eliminates the force tending to separate the connections after the bonding force is removed. This results in extremely reliable physical and electrical connections between the integrated circuit element and substrate.

It is a further object of the invention to provide a method of forming a bonded structure comprising the electrical and physical connections between integrated circuit elements and the corresponding substrate wherein very dense wiring patterns can be accommodated economically and the resulting connections are extremely reliable.

This object is achieved by forming a bonded structure comprising the integrated circuit element input/output pads, composite bumps comprised of a single polymer body with a Young's Modulus which is low compared to metals and a conductive metal coating covering the polymer body, and the substrate input/output pads. The conductive metal coating covering the polymer body must be chosen to provide good adhesion to the polymer body and may include an adhesive layer and a barrier layer in addition to a conductor layer. The composite bump will be deformed during the bonding process and the low Young's Modulus of the polymer, about $0.4 \times 10^6$ to $0.5 \times 10^6$ psi, allows the bond to be made with very low bonding force and greatly reduces or eliminates the force tending to separate the connections after the bonding force is removed. The polymer body and the conductive metal coating must be chosen to be compatible with the temperatures used during the bonding process.

DESCRIPTION OF THE PREFERRED EMBODIMENTS

Figure 1:
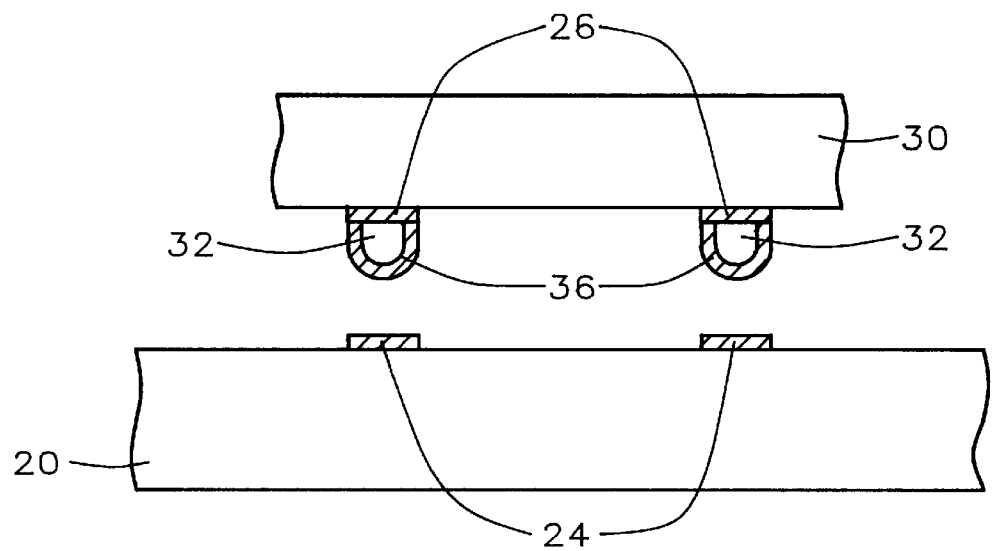
FIG. 1 is a cross sectional representation of the composite bump formed on the integrated circuit element showing the polymer interior and conductive metal coating of the composite bump.
Figure 2:
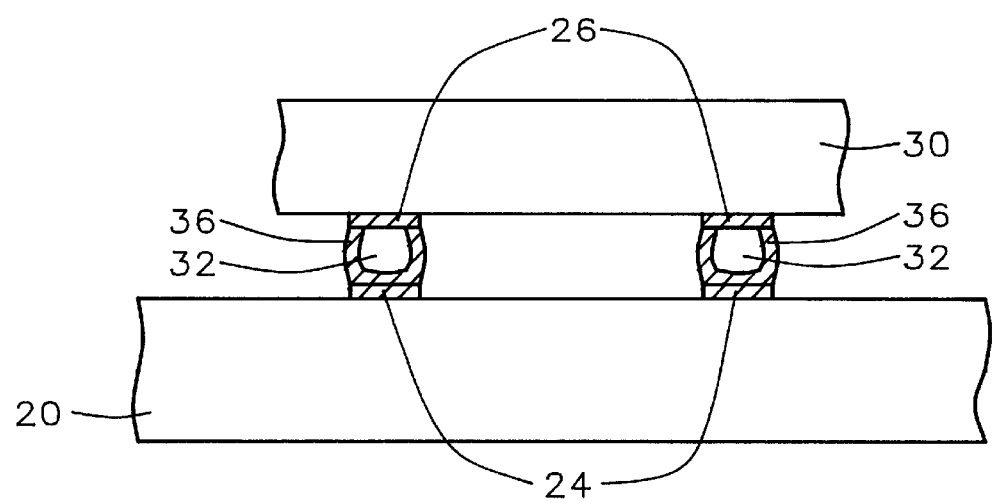
FIG. 2 is a cross sectional representation of the bonded structure with the composite bumps formed on the integrated circuit element prior to bonding.

Refer now more particularly to FIGS. 1 and 2, there is shown an embodiment for the bonded structure of the current invention. Composite bumps are formed on the integrated circuit element 30 input/output pads 26. The input/output pads are formed of a metal such as aluminum with a diameter of about 90 microns. Each composite bump comprises a single polymer body 32 and a conductive metal coating 36 covering the polymer body. The polymer body must withstand temperatures encountered during bonding and can be polyamic acid polyimide such as "PROBIMIDE 7010" or "PROBIMIDE 514" produced by OCG Microelectronic Materials, Inc., Tempe, Ariz. The polymer body has a thickness of between about 5 and 25 microns. Input/output pads 24 are formed on the substrate 20 using a metal such as aluminum.

The conductive metal coating 36 must adhere to the polymer body and can be a metal such as aluminum or nickel; or a composite such as nickel/gold, chrome/gold, chrome/silver, or titanium/platinum. The conductive metal coating can be a composite which includes an adhesion layer/ a barrier layer/a conductor layer such as chrome/copper/gold, chrome/nickel/gold, chrome/silver/gold, titanium/platinum/gold, titanium/palladium/gold, or titanium/tungsten/silver.

When the bonded structure is formed the composite bumps will contact the substrate input/output pads and will be deformed as shown in FIG. 2 so that each composite bump will contact a substrate input/output pad. Due to the low Young's Modulus of the polymer body a very small force, about one tenth that required by the traditional gold bump, is required for this deformation and there is little tendency to separate the bonded structure after it has been formed.

Figure 3:
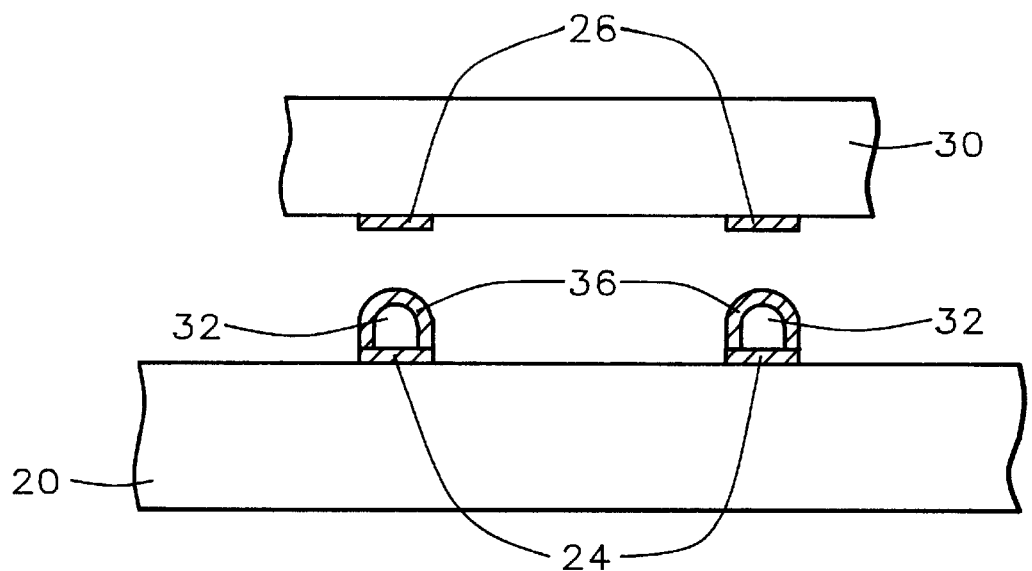
FIG. 3 is a cross sectional representation of the composite bump formed on the substrate showing the polymer interior and conductive metal coating of the composite bump.
Figure 4:
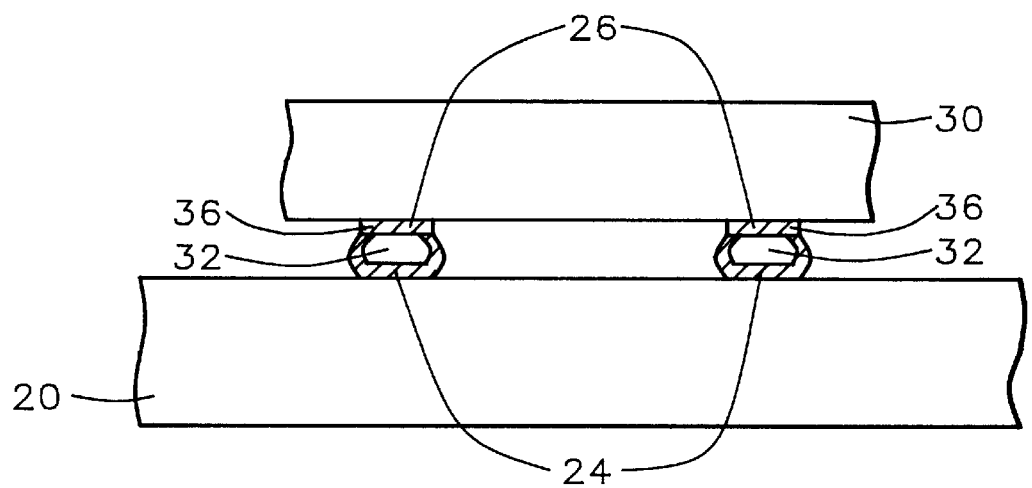
FIG. 4 is a cross sectional representation of the bonded structure with the composite bumps formed on the substrate prior to bonding.

Refer now to FIGS. 3 and 4, there is shown another embodiment of the bonded structure. In this embodiment the composite bumps are formed on the substrate input/output pads 24. The composite bump and the structure after the bond is formed is as described above.

Figure 5:
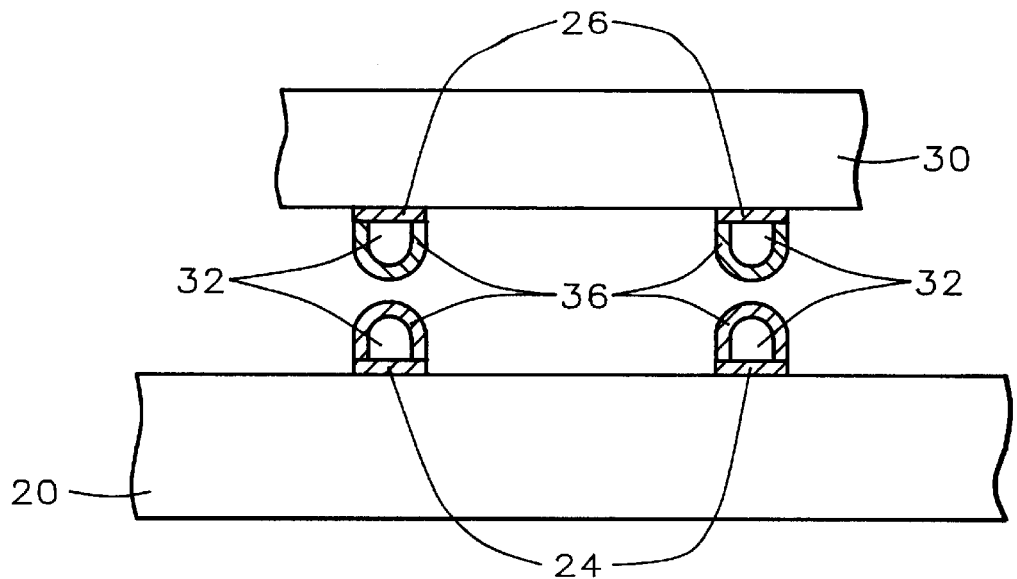
FIG. 5 is a cross sectional representation of the composite bump formed on both the integrated circuit element and the substrate showing the polymer interior and conductive metal coating of the composite bumps.
Figure 6:
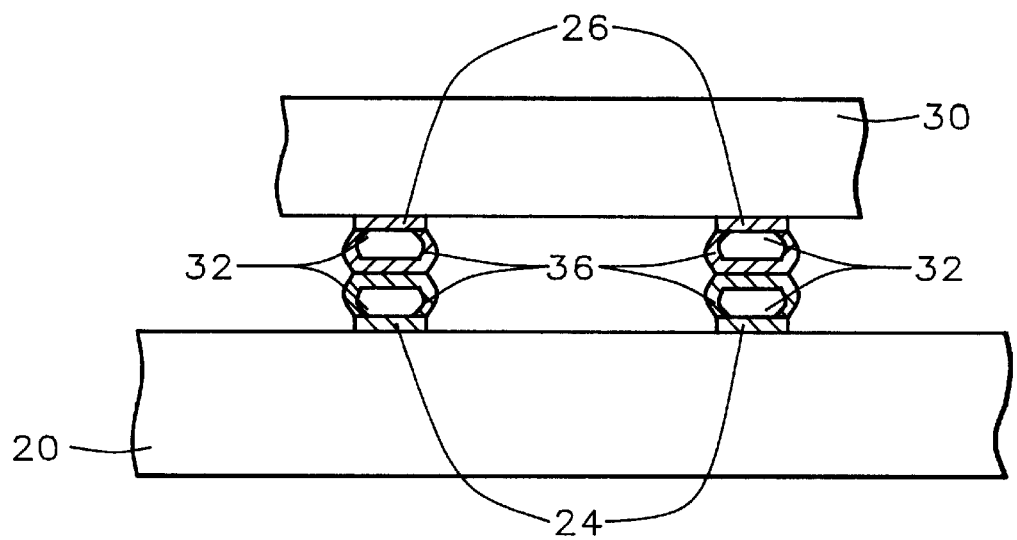
FIG. 6 is a cross sectional representation of the bonded structure with the composite bumps are formed on both the integrated circuit element and the substrate prior to bonding.

Another embodiment is shown in FIGS. 5 and 6. in this embodiment the composite bumps are formed on both the integrated circuit element input/output pads 26 and the substrate input/output pads 24. When the bonded structure is formed the substrate composite bumps are brought together with the integrated circuit element composite bumps. The composite bumps are deformed and due to the low Young's Modulus of the polymer body a very small force is required for this deformation and there is little tendency to separate the bonded structure after it has been formed.

The integrated circuit element 30 and the substrate 20 are brought together so that the conductive metal coating 36 on each composite bump contacts a substrate input/output pad 24 as shown in FIG. 2, an integrated circuit element input/output pad 26 as shown in FIG. 4 or a corresponding composite bump as shown in FIG. 6. The bond is then formed using a bonding process such as thermocompression bonding, ultrasonic bonding, tape automated bonding, application of heat energy, or application of light energy.

Figure 7:
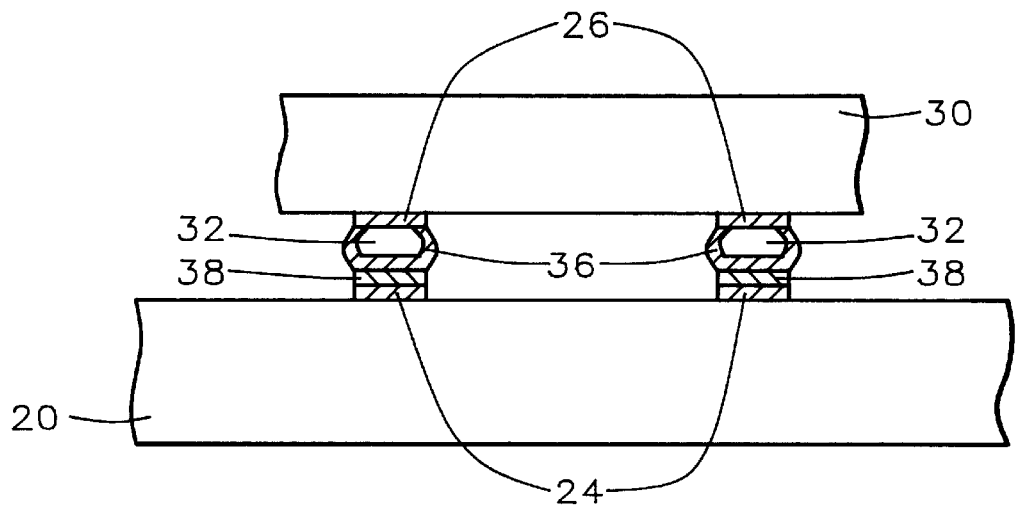
FIG. 7 is a cross sectional representation of the bonded structure wherein a conducting adhesive bonds the conducting metal coating of the composite bump to the substrate input/output pad.
Figure 8:
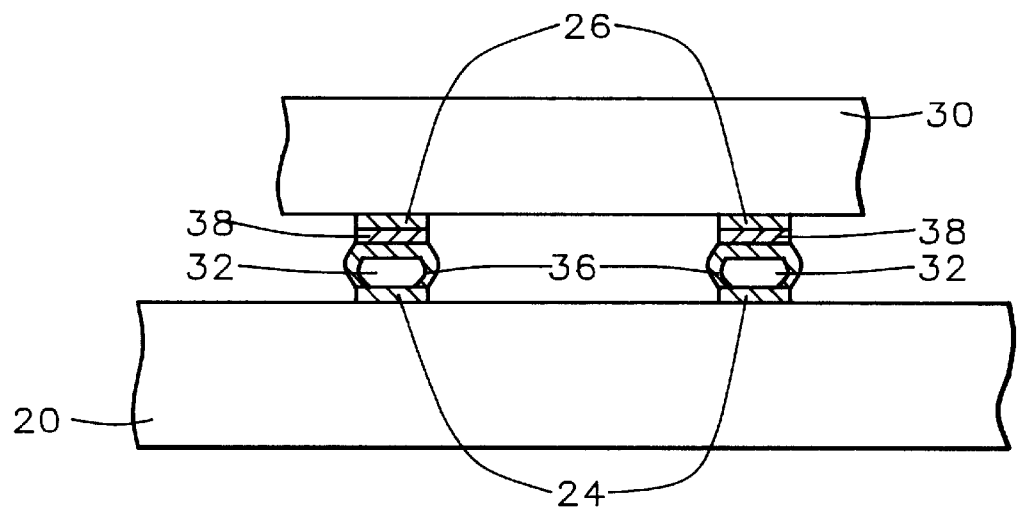
FIG. 8 is a cross sectional representation of the bonded structure wherein a conducting adhesive bonds the conducting metal coating of the composite bump to the integrated circuit element input/output pad.
Figure 9:
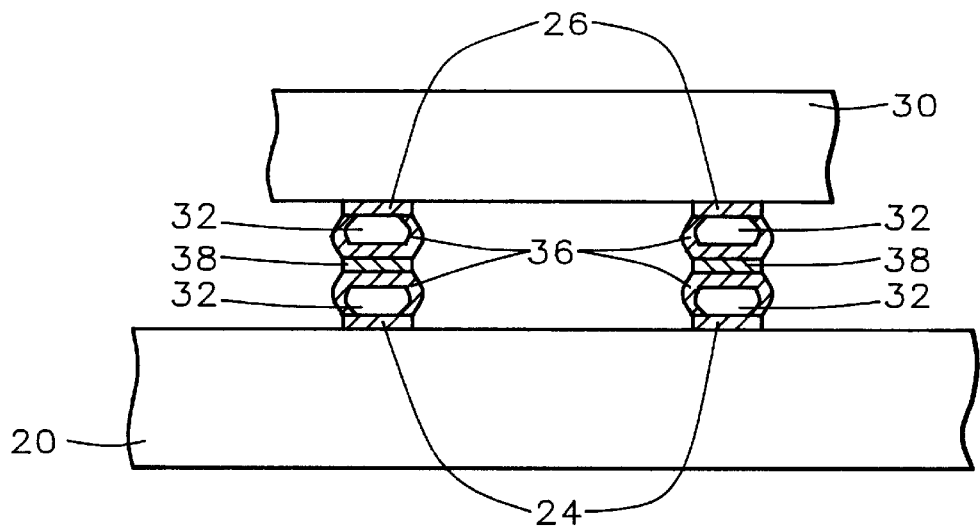
FIG. 9 is a cross sectional representation of the bonded structure wherein a conducting adhesive bonds the conducting metal coating of the integrated circuit element composite bump to the substrate composite bump.
Figure 10:
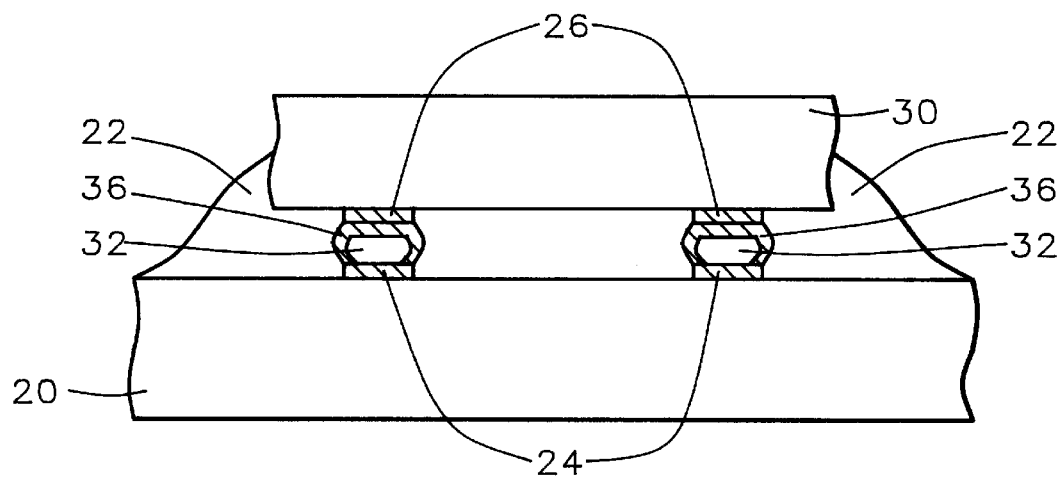
FIG. 10 is a cross sectional representation of the bonded structure wherein a non conducting adhesive bonds the integrated circuit element to the substrate.

As shown in FIGS. 7, 8, and 9 the bonding may also be accomplished using a conductive adhesive 38 between the conductive metal coating 36 of each composite bump and the corresponding substrate pad 24 shown in FIG. 7, the corresponding integrated circuit element input/output pad 26 shown in FIG. 8, or the corresponding composite bump shown in FIG. 9. As shown in FIG. 10, the bonding may also be accomplished using a nonconductive adhesive 22 between the integrated circuit element 30 and substrate 20. The conductive and nonconductive adhesives may require the application of heat energy or light energy. During the bonding process the polymer body in each composite bump is deformed as electrical connection is formed. This deformation is important in forming a good electrical contact. Due to the low Young's Modulus of the polymer body this deformation requires a very small bonding force and produces little or no tendency to separate the connection after it has been made.

While the invention has been particularly shown and described with reference to the preferred embodiments thereof, it will be understood by those skilled in the art that various changes in form and details may be made without departing from the spirit and scope of the invention.

What is claimed is:

1. A method of forming a bonded structure, comprising:
   providing an integrated circuit element with integrated circuit element input/output pads;
   providing a substrate with substrate input/output pads;
   providing a single polymer body on each said substrate input/output pad;
   providing a conductive metal coating upon said single polymer body on each said substrate input/output pad and covering each said substrate input/output pad wherein each said single polymer body and said conductive metal coating comprises a composite bump;
   bringing together said integrated circuit element and said substrate so that said composite bumps contact said integrated circuit input/output pads and are deformed during said contact; and
   bonding said composite bumps to said integrated circuit element input/output pads.

2. A method of forming a bonded structure, comprising:
   providing an integrated circuit element with integrated circuit element input/output pads;
   providing a substrate with substrate input/output pads;
   providing a single polymer body on each said integrated circuit element input/output pad and each said substrate input/output pad;
   providing a conductive metal coating upon said single polymer body on each said integrated circuit element input/output pad and covering each said integrated circuit element input/output pad, and on each said substrate input/output pad and covering each said substrate input/output pad wherein each said single polymer body and said conductive metal coating comprises a composite bump;
   bringing together said integrated circuit element and said substrate so that said composite bumps contact and are deformed during said contact; and
   bonding said integrated circuit element to said substrate.

3. A method of forming a bonded structure, comprising:
providing an integrated circuit element with integrated circuit element input/output pads;
providing a substrate with substrate input/output pads;
providing a single polymer body on each said integrated circuit element input/output pad, wherein said polymer is polyamic acid polyimide and the cross section area of said single polymer body on each said integrated circuit element input/output pad has a circular shape and is smaller than that of each said integrated circuit element input/output pad;
providing a conductive metal coating upon said single polymer body on each said integrated circuit element input/output pad and covering each said integrated circuit element input/output pad wherein each said single polymer body and said conductive metal coating comprises a composite bump;
bringing together said integrated circuit element and said substrate so that said composite bumps contact said substrate input/output pads and are deformed during said contact; and
bonding said composite bumps to said substrate input/output pads.

4. A method of forming a bonded structure, comprising:
providing an integrated circuit element with integrated circuit element input/output pads;
providing a substrate with substrate input/output pads;
providing a single polymer body on each said integrated circuit element input/output pad, wherein the cross section area of said single polymer body on each said integrated circuit element input/output pad has a circular shape and is smaller than that of each said integrated circuit element input/output pad;
providing a conductive metal coating upon said single polymer body on each said integrated circuit element input/output pad and covering each said integrated circuit element input/output pad wherein each said single polymer body and said conductive metal coating comprises a composite bump;
bringing together said integrated circuit element and said substrate so that said composite bumps contact said substrate input/output pads and are deformed during said contact; and
bonding said composite bumps to said substrate input/output pads wherein said bonding is provided by a conductive adhesive between said composite bumps and said substrate input/output pads.

5. The method of claim 1 wherein said bonding is provided by a conductive adhesive between said composite bumps and said integrated circuit input/output pads.

6. The method of claim 2 wherein said bonding is provided by a conductive adhesive between said composite bumps.

7. A method of forming a bonded structure, comprising:
providing an integrated circuit element with integrated circuit element input/output pads;
providing a substrate with substrate input/output pads;
providing a single polymer body on each said integrated circuit element input/output pad, wherein the cross section area of said single polymer body on each said integrated circuit element input/output pad has a circular shape and is smaller than that of each said integrated circuit element input/output pad;
providing a conductive metal coating upon said single polymer body on each said integrated circuit element input/output pad and covering each said integrated circuit element input/output pad wherein each said single polymer body and said conductive metal coating comprises a composite bump;
bringing together said integrated circuit element and said substrate so that said composite bumps contact said substrate input/output pads and are deformed during said contact; and
bonding said composite bumps to said substrate input/output pads wherein said bonding is provided by thermocompression bonding.

8. A method of forming a bonded structure, comprising:
providing an integrated circuit element with integrated circuit element input/output pads;
providing a substrate with substrate input/output pads;
providing a single polymer body on each said integrated circuit element input/output pad, wherein the cross section area of said single polymer body on each said integrated circuit element input/output pad has a circular shape and is smaller than that of each said integrated circuit element input/output pad;
providing a conductive metal coating upon said single polymer body on each said integrated circuit element input/output pad and covering each said integrated circuit element input/output pad wherein each said single polymer body and said conductive metal coating comprises a composite bump;
bringing together said integrated circuit element and said substrate so that said composite bumps contact said substrate input/output pads and are deformed during said contact; and
bonding said composite bumps to said substrate input/output pads wherein said bonding is provided by application of heat energy.

9. A method of forming a bonded structure, comprising:
providing an integrated circuit element with integrated circuit element input/output pads;
providing a substrate with substrate input/output pads;
providing composite bumps;
bringing together said integrated circuit element and said substrate thereby forming a structure comprised of said integrated circuit element input/output pads, said substrate input/output pads, and said composite bumps; and
bonding said structure by means of a tape automated bonding process.

10. The method of claim 9 wherein said composite bumps are formed by means of providing a single polymer body on each said integrated circuit element input/output pad, and providing a conductive metal coating upon said single polymer body on each said integrated circuit element input/output pad and covering each said integrated circuit element input/output pad wherein each said single polymer body and said conductive metal coating comprise one of said composite bumps.

11. The method of claim 9 wherein said composite bumps are formed by means of providing a single polymer body on each said substrate input/output pad, and providing a conductive metal coating upon said single polymer body on each said substrate input/output pad and covering each said substrate input/output pad wherein each said single polymer body and said conductive metal coating comprise one of said composite bumps.

12. The method of claim 9 wherein said composite bumps are formed by means of providing a single polymer body on each said integrated circuit element input/output pad and each said substrate input/output pad, wherein each single polymer body and said conductive metal coating comprises a composite bump.

13. A method of forming a bonded structure, comprising:

providing an integrated circuit element with integrated circuit element input/output pads;

providing a substrate with substrate input/output pads;

providing a single polymer body on each said integrated circuit element input/output pad, wherein the cross section area of said single polymer body on each said integrated circuit element input/output pad has a circular shape and is smaller than that of each said integrated circuit element input/output pad;

providing a conductive metal coating upon said single polymer body on each said integrated circuit element input/output pad and covering each said integrated circuit element input/output pad wherein each said single polymer body and said conductive metal coating comprises a composite bump;

bringing together said integrated circuit element and said substrate so that said composite bumps contact said substrate input/output pads and are deformed during said contact wherein said conductive metal coating consists of aluminum and said polymer body and said conductive metal coating have such thickness and material characteristics that said composite bumps are deformed and crushed into physical and electrical contact with said substrate input/output pads; and bonding said composite bumps to said substrate input/output pads.

14. The method of claim 1 wherein said conductive metal coating consists of aluminum and said polymer body and said conductive metal coating have such thickness and material characteristics that said composite bumps are deformed and crushed into physical and electrical contact with said integrated circuit element input/output pads.

15. The method of claim 2 wherein said conductive metal coating consists of aluminum and said polymer body and said conductive metal coating have such thickness and material characteristics that said composite bumps are deformed and crushed into physical and electrical contact.

16. The method of claim 1 wherein said polymer is polyamic acid polyimide.

17. The method of claim 2 wherein said polymer is polyamic acid polyimide.

18. The method of claim 10 wherein said conductive metal coating consists of aluminum.

19. The method of claim 11 wherein said conductive metal coating consists of aluminum.

20. The method of claim 12 wherein said conductive metal coating consists of aluminum.

* * * * *